United States Patent [19]

Barre

[11] Patent Number: 4,695,927
[45] Date of Patent: Sep. 22, 1987

[54] PACKAGE FOR A SURFACE MOUNTABLE COMPONENT

[75] Inventor: Lucien Barre, Tours, France

[73] Assignee: Thomson-CSF, Paris, France

[21] Appl. No.: 884,493

[22] Filed: Jul. 11, 1986

[30] Foreign Application Priority Data

Jul. 12, 1985 [FR] France .................. 85 10720

[51] Int. Cl.⁴ .............................. H05K 1/11
[52] U.S. Cl. .................................. 361/400; 361/403; 361/417; 338/333
[58] Field of Search ............... 361/417, 400, 401, 402, 361/403, 404, 405, 406; 338/333

[56] References Cited

U.S. PATENT DOCUMENTS

| | | | |
|---|---|---|---|
| 2,773,159 | 12/1956 | Taggart | 338/333 |
| 4,333,069 | 6/1982 | Worth et al. | 338/315 |
| 4,339,785 | 7/1982 | Ohsawa | 361/403 |

FOREIGN PATENT DOCUMENTS

| | | |
|---|---|---|
| 968665 | 3/1958 | Fed. Rep. of Germany . |
| 1495139 | 8/1967 | France . |
| 2385203 | 10/1978 | France . |
| 2037489 | 7/1980 | United Kingdom ............... 361/400 |

OTHER PUBLICATIONS

Electronic Engineering, vol. 54, No. 666, Jun. 1982, pp. 154–156, "Technology Focus, Surface Mounting on PCB's".

Primary Examiner—Robert S. Macon
Attorney, Agent, or Firm—Roland Plottel

[57] ABSTRACT

A surface contact electrical component having two cylindrical, exposed, conductive end caps and a plastic body therebetween. The body has substantially planar upper and lower faces. The separation of the upper and lower faces is slightly less than the diameter of the end caps so that a layer of glue may be placed between the body and a printed circuit board when the end caps are in contact with the printed circuit board.

2 Claims, 3 Drawing Figures

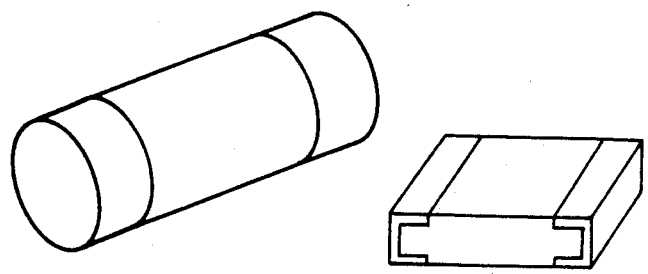
FIG_1 PRIOR ART
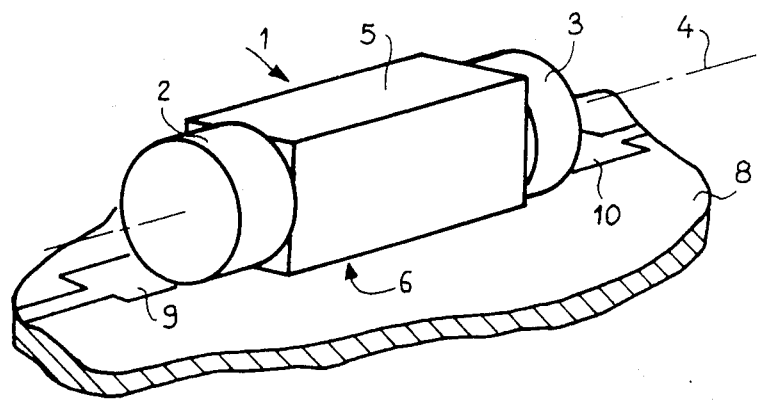
FIG_2
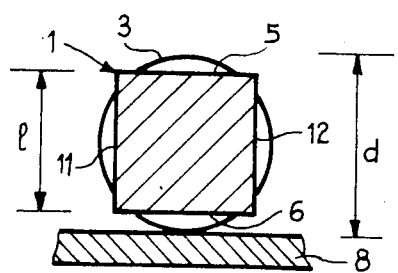
FIG_3

PACKAGE FOR A SURFACE MOUNTABLE COMPONENT

FIELD OF THE INVENTION

This invention relates to packaging of surface mountable components and mainly to packaging of components having two connections, although it may also be applicable to components having more than two connections.

A recent way of mounting components on printed circuit boards is called surface mounting of components, which means that components, instead of being inserted in holes of the printed board and soldered at the rear of the board, are placed and soldered on the printed side of the board.

DESCRIPTION OF THE PRIOR ART

During handling of the components prior to soldering (particularly wave soldering), there is a problem of instability of the components since they tend to roll on the board instead of remaining in proper place. This problem has been solved in the past by using parallelepipedic components instead of cylindrical components.

The invention proposes a new type of surface mountable component which avoids the instability while lowering the production cost comparatively to the cost of parallelepipedic components.

SUMMARY OF THE INVENTION

The component comprises a body having two cylindrical exposed conductive end caps extending along a common axis, and a plastic body between said end caps, said body having a substantially planar upper face and a substantially planar lower face, said upper and lower faces being separated by a distance which is slightly smaller than the diameter of said end caps so that a layer of glue may be placed between the body and a printed circuit when the component is placed on such a circuit board with its end caps in contact with the printed circuit board.

BRIEF DESCRIPTION OF THE DRAWINGS

Other characteristics and advantages of the invention will become apparent on reading the detailed description which follows and which is given with reference to the appended drawings in which:

FIG. 1 shows two types of components of the prior art,

FIG. 2 shows the component of the invention,

FIG. 3 shows a cross section of the component showing the relative dimensions of the body and end caps of the component.

DESCRIPTION OF THE PREFERRED EMBODIMENTS

The component is shown in FIGS. 2 and 3. It may be for instance a diode capable of handling a power consumption of 1 watt or above.

The diode has two terminal electrodes each constituted by a cylindrical conductive end cap (2 and 3 respectively). The end caps are arranged along a common axis shown at reference 4.

Costs of manufacture of such electrodes are reduced compared to non cylindrical electrodes (for similar power consumption).

The end caps are electrically connected to an encapsulated electrical element, not shown, which is for instance a semiconductive chip soldered or pressed against the caps.

The electrical element is protected by a molded plastic body I which surrounds it completely but leaves exposed the conductive cylindrical end caps of the component.

Instead of molding the plastic body with a shape which is an extension of the shape of the terminal electrodes, as it is usual, that is with a cylindrical shape for cylindrical terminal electrodes, or with a rectangular shape (or rectangular terminal electrodes), the body is unexpectedly molded with a substantially rectangular shape althouth the end caps are cylindrical.

More specifically, the plastic body 1 comprises at least two substantially planar faces which are respectively an upper face 5 and a lower face 6, respectively extending parallel to axis 4 between the end caps.

When the component is placed on a printed circuit board 8, its lower face 6 is turned towards the board and is substantially parallel to the board. However, it is not directly in contact with the board; rather it is preferably spaced from it for instance by about one tenth of a millimeter, so that glue may be interposed between face 6 and the board 8 while the exposed end caps 2 and 3 are in contact with printed conductors 9, 10 of the printed circuit board.

The upper face 5 being substantially planar, it allows easy picking up of the component by a vacuum suction handling apparatus for placement of the component at the proper place and in a proper position.

The lower face 6 being also substantially planar, it avoids rolling of the component on the board during handling of the board after placement of the components on the board and prior to soldering the components in a solder bath (wave soldering).

FIG. 3 shows the shape (voluntarily enlarged on the drawing) which remains between the lower face 6 of the body and the printed board 8 when the end caps are in contact with the board.

The diameter d of the end caps is therefore slightly larger (by for instance one tenth of a millimiter) than the distance l between the upper and lower faces 5 and 6 of the body.

Preferably the body has four substantially planar faces, that is it also has a left face 11 and a right face 12 which extend parallel to axis 4 of the end caps and the cross section of the body is preferably square so that the component may be indifferently placed in any one of the four positions in which one face is parallel to the printed circuit board.

By way of typical exemple the diameter of the end caps may be of a few millimeters.

What is claimed is:

1. An electrical component comprising two cylindrical exposed conductive end caps extending along a common axis, and a plastic body between said end caps, said body having a substantially planar upper face and a substantially planar lower face, said upper and lower faces being separated by a distance which is slightly smaller than the diameter of said end caps so that a layer of glue may be placed between the body and a printed circuit when the component is placed on such a circuit board with its end caps in contact with the printed circuit board.

2. An electrical component according to claim 1 wherein said body has four substantially planar faces extending parallel to the common axis of the component.

* * * * *